United States Patent
Brucchi et al.

(10) Patent No.: US 9,716,018 B2
(45) Date of Patent: Jul. 25, 2017

(54) METHOD OF MANUFACTURING BASEPLATE FOR AN ELECTRONIC MODULE

(71) Applicant: Infineon Technologies AG, Neubiberg (DE)

(72) Inventors: Fabio Brucchi, Villach (AT); Davide Chiola, Villach (AT)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/070,942

(22) Filed: Mar. 15, 2016

(65) Prior Publication Data

US 2016/0196989 A1    Jul. 7, 2016

Related U.S. Application Data

(62) Division of application No. 14/251,609, filed on Apr. 13, 2014, now Pat. No. 9,305,874.

(51) Int. Cl.
| | |
|---|---|
| *H01L 21/00* | (2006.01) |
| *H01L 21/48* | (2006.01) |
| *H01L 23/498* | (2006.01) |
| *H01L 23/13* | (2006.01) |
| *H01L 23/36* | (2006.01) |
| *H01L 23/373* | (2006.01) |
| *H01L 25/11* | (2006.01) |
| *H01L 21/56* | (2006.01) |

(52) U.S. Cl.
CPC ...... *H01L 21/4875* (2013.01); *H01L 21/4878* (2013.01); *H01L 21/565* (2013.01); *H01L 23/13* (2013.01); *H01L 23/36* (2013.01); *H01L 23/3735* (2013.01); *H01L 23/49811* (2013.01); *H01L 23/49838* (2013.01); *H01L 23/49861* (2013.01); *H01L 25/115* (2013.01); *H01L 2224/291* (2013.01); *H01L 2224/2919* (2013.01); *H01L 2224/32225* (2013.01); *H01L 2924/15153* (2013.01)

(58) Field of Classification Search
CPC .................................................. H01L 23/49833
See application file for complete search history.

(56) References Cited

U.S. PATENT DOCUMENTS

| | | | | |
|---|---|---|---|---|
| 5,986,340 A | * | 11/1999 | Mostafazadeh | ....... H01L 23/055 257/675 |
| 6,184,463 B1 | * | 2/2001 | Panchou | ................. H01L 22/00 174/548 |
| 6,331,737 B1 | | 12/2001 | Lim et al. | |
| 6,586,829 B1 | * | 7/2003 | Yaniv | ...................... H01L 23/13 257/693 |

(Continued)

FOREIGN PATENT DOCUMENTS

| CN | 101656248 A | 2/2010 |
|---|---|---|
| CN | 101872749 A | 10/2010 |

(Continued)

*Primary Examiner* — Thao P Le

(57) ABSTRACT

Various embodiments provide methods for manufacturing a baseplate for an electronic module and an electronic module comprising a baseplate, wherein the baseplate comprises a conductive material; and a recess formed in one main surface of the baseplate and being adapted to accommodate an electronic chip.

18 Claims, 2 Drawing Sheets

(56) References Cited

U.S. PATENT DOCUMENTS

| | | |
|---|---|---|
| 7,791,177 B2* | 9/2010 | Wieneke Kessler ............... H01L 23/3107 257/666 |
| 8,847,376 B2 | 9/2014 | Oganesian et al. |
| 2003/0235038 A1 | 12/2003 | Goebl |
| 2004/0090756 A1* | 5/2004 | Ho ..................... H01L 21/6835 361/767 |
| 2004/0229399 A1* | 11/2004 | Chen ................... H01L 21/563 438/108 |
| 2004/0232435 A1 | 11/2004 | Hofer et al. |
| 2012/0286297 A1* | 11/2012 | Wang ................... H01L 33/486 257/88 |
| 2013/0037925 A1 | 2/2013 | Low et al. |
| 2013/0161801 A1 | 6/2013 | Otremba et al. |

FOREIGN PATENT DOCUMENTS

| | | |
|---|---|---|
| CN | 101872757 A | 10/2010 |
| DE | 10 2006 008 807 | 9/2007 |

* cited by examiner

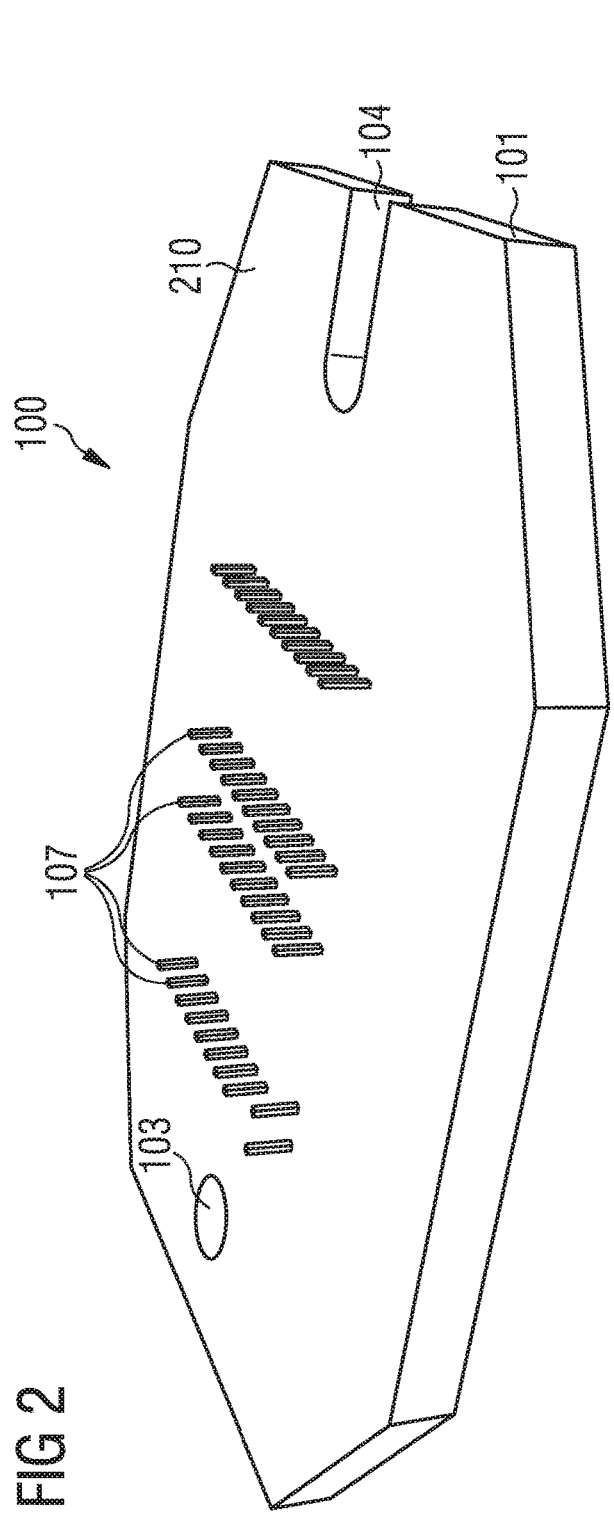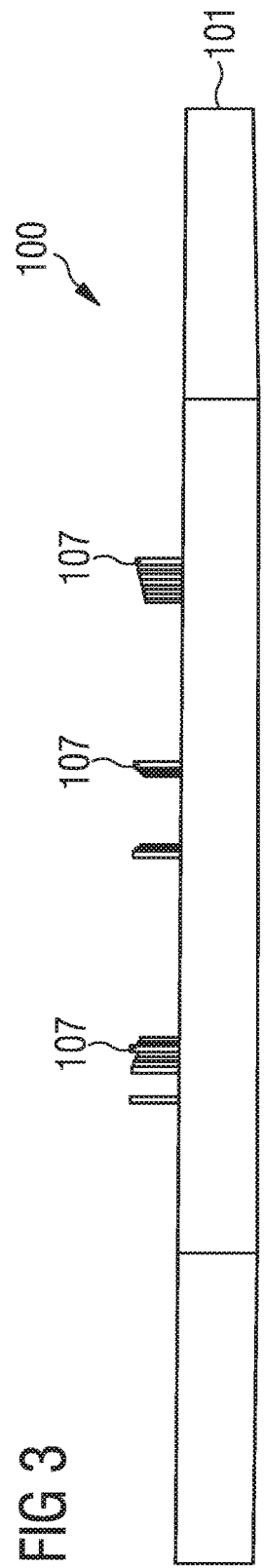

METHOD OF MANUFACTURING BASEPLATE FOR AN ELECTRONIC MODULE

RELATED APPLICATION

This application is a divisional of application Ser. No. 14/251,609, filed on Apr. 13, 2014 and published on Oct. 15, 2015 as US 2015/0294931, now pending. The patent application identified above is incorporated herein by reference in its entirety to provide continuity of disclosure.

TECHNICAL FIELD

Various embodiments relate to a baseplate for an electronic module, an electronic module and method of manufacturing a baseplate for an electronic module.

BACKGROUND

In many technical fields electronic modules, e.g. so called power modules, are used for providing or switching power to electrical components or devices. One possible field is the automotive field, for example. Most of the power modules comprises at least one transistor, e.g. an IGBT (insulated gate bipolar transistor). Efficiency within an IGBT power module is a major challenge when designing new power modules. One factor that affects the efficiency and possible switching frequencies of a power module is stray inductance. Stray inductance is directly influenced by the design of the power module and less by the basic physics of the module. Conventional IGBT power module designs tend to sacrifice stray inductance in order to increase power density of the module. This normally includes separating the positive (+) and negative (−) DC paths on the substrate, laterally bonding across the main current flow path to ease the bonding of the power transistor chips to various potentials in the power module, and/or providing repetitive layouts for the ease of manufacture due to the number of common elements present in the module. In each case, the result is an increase in stray inductance within the power module and thus reduced efficiency. Furthermore, standard power modules using bare dice are presently used also in the lower power ranged and having the drawback of high costs, especially for small volumes.

SUMMARY

Various embodiments provide a baseplate for an electronic module, wherein the baseplate comprises a conductive material; and a recess formed in one main surface of the baseplate and being adapted to accommodate an electronic chip.

Furthermore, various embodiments provide an electronic module, comprising a baseplate according to an exemplary embodiment and an electronic chip placed in the recess of the baseplate.

Moreover, various embodiments provide a method of manufacturing a baseplate for an electronic module, wherein the method comprises providing a baseplate; and forming a recess in one main surface of the baseplate, wherein the recess is adapted to accommodate an electronic chip.

BRIEF DESCRIPTION OF THE DRAWINGS

In the drawings, like reference characters generally refer to the same parts throughout the different views. The drawings are not necessarily to scale. Instead emphasis is generally being placed upon illustrating the principles of the invention. In the following description, various embodiments are described with reference to the following drawings, in which:

FIG. 2 shows a perspective view of the electronic module of FIG. 1 including an insulating layer; and FIG. 3 shows a side view of the electronic module of FIG. 2.

DETAILED DESCRIPTION

Figure 1:
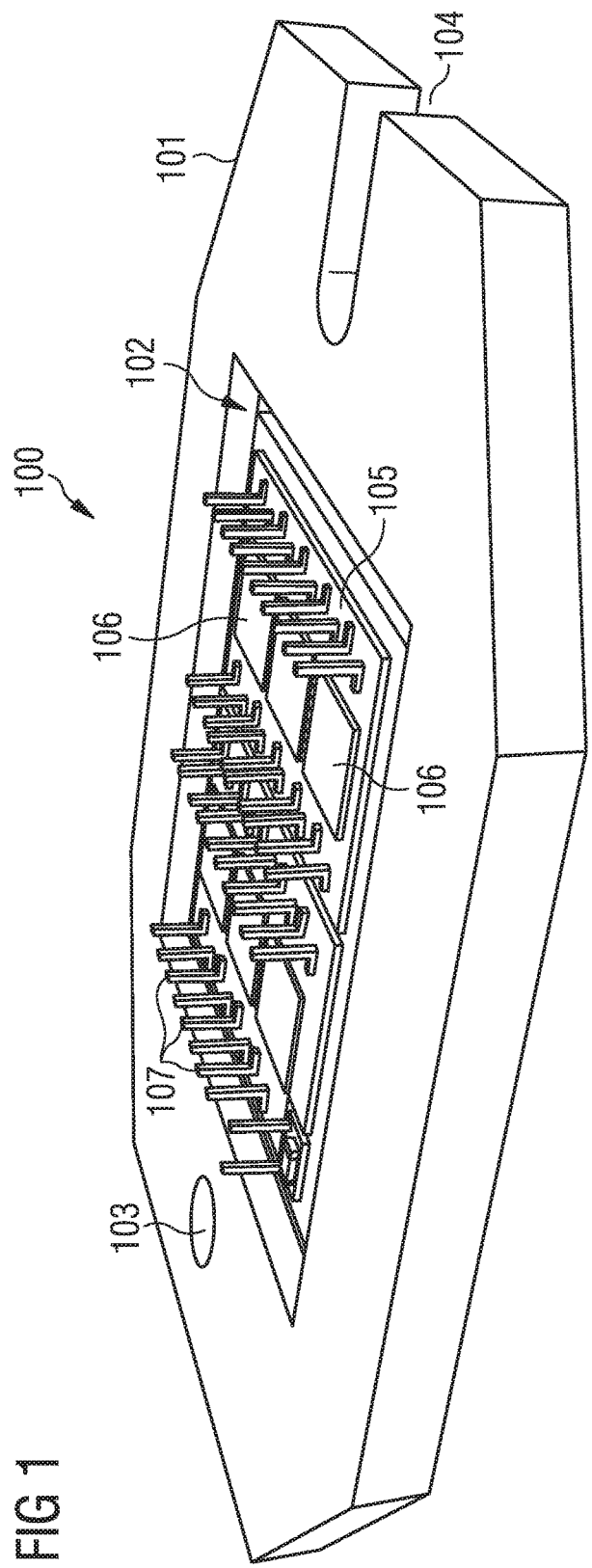
FIG. 1 shows a perspective view of components of an electronic module.

In the following further exemplary embodiments of a semiconductor device and a method of manufacturing a semiconductor device will be explained. It should be noted that the description of specific features described in the context of one specific exemplary embodiment may be combined with others exemplary embodiments as well.

The word "exemplary" is used herein to mean "serving as an example, instance, or illustration". Any embodiment or design described herein as "exemplary" is not necessarily to be construed as preferred or advantageous over other embodiments or designs.

Various embodiments provide a method of manufacturing an electronic module, wherein the method comprises providing a baseplate according to an exemplary embodiment; arranging an electronic chip in the recess of the baseplate. Preferably, the electronic chip is electrically and/or thermally contacted to the baseplate either directly or indirectly. For example, the electronic chip may be adhered to a contacting area in the recess, e.g. by using an (conductive) epoxy adhesive or solder. Optionally, a cover or insulating layer may be arranged on the one main surface of the baseplate and covering the arranged electronic chip. In addition or alternatively a mold compound may be formed around at least portions of the baseplate and may form an encapsulation of the electronic module.

In particular, the electronic module may be a power module. For example, the electronic chip may be a die, a packaged electronic chip or pre-packaged die. The recess of the baseplate may form a blind hole. Preferably, the recess may have a depth corresponding or adapted to a thickness of the electronic chip intended to be placed or arranged in the recess. Preferably, the electronic chip is a packaged electronic chip, e.g. may comprise a molded encapsulation. For example, the electronic chip may be a small outline transistor (SOT) package or small outline nonleaded transistor (SON) package. In particular, the carrier may comprise a plurality of recesses. While lateral sizes of the baseplate and the electronic module may be adapted with respect to any desired application of the same, typical sizes of the baseplate may be in the range of 10 mm to 200 mm in both lateral dimensions.

By providing a recess in a baseplate for an electronic module it may be possible to produce application specific low cost power sub-systems using SOT and/or SON packages which may be arranged in the recess. This may enable cheaper solutions than standard power modules in the power range from few hundred watts up to 10 kW or even more. Furthermore, the conductive material of the baseplate, which partially surround the electronic chip, may allow to significantly reduce stray inductances of the power package which in turn may allow fast switching devices (IGBT, diodes and/or MOSFETs) to be used reducing significantly power losses. A potential application may be a power module for a welding machine, for example.

In the following exemplary embodiments of the baseplate are described. However, the features and elements described with respect to these embodiments can be combined with exemplary embodiments of the electronic module and the method of manufacturing a baseplate as well.

According to an exemplary embodiment of the baseplate the recess has a depth adapted to fully accommodate the electronic chip.

In particular, the depth of the recess may be in range between 1 mm and 10 mm, preferably in the range between 2 mm and 7 mm, more preferably in the range between 2.5 mm and 5.5 mm. It should be noted that preferably the recess may have a depth which is suitable that the electronic chip can be accommodated together with a substrate or carrier the electronic chip or die is attached to.

According to an exemplary embodiment of the baseplate the baseplate has a thickness in the range between 2.5 mm and 7 mm.

In particular, the thickness of the baseplate may be in the range between 3.0 mm and 6.0 mm, preferably between 3.5 mm and 5 mm. The use of relative low baseplates comprising a recess into which the electronic chip, e.g. a pre-packaged dice, may be arranged may ensure high performances at high switching frequency due to the reduced height and total parasitic parameters due to the conductive material of the baseplate and due to potential very low coupling capacitances.

According to an exemplary embodiment of the baseplate the baseplate comprises a material selected out of the group consisting of aluminum, brass and copper.

In principle, any suitable metal or other material which is commonly used for baseplates or carriers may be used. The base plate may comprise one or several of the materials or may consist of one or several of these materials. Said baseplate might comprise Metal Matrix Composite or other sintered metals. In particular, the material should have a thermal and/or electrical conductivity suitable for the intended application. For example it may be possible to provide a relatively cost efficient aluminum based baseplate.

According to an exemplary embodiment of the baseplate in the recess a contact area is formed.

In particular, the contact area or a plurality of contact areas may form contact pads, pins or contact terminals adapted to be electrically contacted to terminals or pads of the electronic chip or chip package. For example, the contact areas may be adapted for surface mounting technology, i.e. may be adapted that a surface mounting device is contacted to the contact areas. In addition or alternatively, the contact areas or the baseplate itself may also function as heatsinks. Additionally, it should be mentioned that the electronic chip, including a potential substrate it is mounted on, can be attached to the contact area by an adhesive: like an epoxy adhesive, a solder or sintered layer.

In the following exemplary embodiments of the electronic module are described. However, the features and elements described with respect to these embodiments can be combined with exemplary embodiments of the baseplate and the method of manufacturing a baseplate as well.

According to exemplary embodiments of the electronic module the electronic chip is a pre-packaged dice.

The using of a potential low cost leadless or leaded pre-packaged dice may enable different pick-and-place methods and low cost manufacturing processes. In case pre-packaged dices are used also the sensitivity of the electronic module or device to production issues and may lead to higher reliability of the electronic module itself due to mechanical and chemical protection offered by SOT and SON packages. In addition this may strongly reduce the needs to creepage distance towards packaging plastic cover and may reduce the total height of the electronic module or power module. It may also be possible to apply a mechanical pressure directly on top of the electronic chip or pre-packaged dice once it has been arranged or assembled in the recess of the baseplate. Thus, it may be possible to improve the thermal resistance due to providing a better adhesion to the baseplate or heatsink. This technology as well may enable double sided cooling solutions.

Furthermore, the use of pre-packaged dices may enable a better insulation of the electronic chips which is sometimes demanded by manufacturers or users in order to avoid the possibility that a user or operator can come in contact with swinging portions of the electronic or power module, like heatsinks which may swing at high voltages, for example. In addition the double isolation and in particular the use of an electrical conductive material for the baseplate, forming a portion of a second isolation (in particular with respect to stray fields) the electronic module may have a relative low stray inductance even if the package (e.g. SON or SOT) may have a relative high stray inductance.

In addition, the use of pre-packaged dices may enable high reliability of the electronic module, especially in high temperature and high humidity stress, like conditions described in the HTRB, HTGS, AC, THB, and H3TRB tests.

According to exemplary embodiments of the electronic module the electronic chip is attached to the baseplate.

For example, the electronic chip may be attached by surface mounting technology directly or indirectly to the baseplate. For example, the electronic chip or die may be attached to a substrate or carrier by surface mounting technology, while the substrate or carrier is attached to the baseplate by an adhesive, for example. Preferably, the electronic chip is attached to the baseplate in such a way that the electronic chip is completely accommodated by the recess. That is, the thickness of the electronic chip including an optional attachment or adhering layer is preferably smaller than a depth of the recess. For example, when using pre-packaged SON and/or SOT (forming isolated sub-assemblies) attached or mounted onto PCB substrate or even directly on the baseplate in the recess the baseplate may as well form a heatsink. Thus, it may be possible to avoid a split heatsink and a complex mechanical structure to sustain a split or separated heatsink which may in turn significantly reduce the costs in the manufacturing process.

According to an exemplary embodiment of the electronic module the electronic chip is arranged on a carrier.

The carrier or substrate may then be attached to the baseplate. In particular, the carrier may be a substrate, a direct bonded copper (DBC) substrate or carrier.

According to an exemplary embodiment of the electronic module the electronic chip is adhered to the baseplate.

For example an epoxy adhesive or solder may be used for adhering the electronic chip to the baseplate, in particular in the recess of the baseplate. As already mentioned this may be done either directly or indirectly.

According to an exemplary embodiment the electronic module further comprises an insulating layer arranged on the one main surface of the baseplate.

For example, the insulating layer may comprise or may be formed or consist of a thin foil or film of a suitable insulating material like Kapton. By providing such an insulating or cover layer it may be possible to arrange, e.g. by soldering, a PCB on top of the electronic module. Alternatively or additionally, a conductive layer may be arranged on the one main surface. It should be mentioned that the thin foil or film may have a size or cover an area which is larger than an area or size of the baseplate. That is, the thin foil or film may extend further than the baseplate. Alternatively, the size of the thin foil or film may be smaller or equal to the size or area of the base plate. For example the thin foil or film may exactly cover the base plate.

According to an exemplary embodiment the electronic module further comprises a mold compound at least partially encapsulating the baseplate and the electronic chip placed in the recess of the baseplate.

According to an exemplary embodiment the electronic module further comprises terminals arranged to contact the electronic chip with an exterior of the electronic module.

In particular, the terminals may be any suitable terminals, like snap-in terminals, pressfit terminals, spring terminal, or any other interlocking terminal having a mechanical and an electrical functionality at the same time.

According to an exemplary embodiment the electronic module comprises a plurality of baseplates and a plurality of electronic chips placed in the plurality of recesses of the plurality of baseplates.

In particular, in each recess of each baseplate the same number of electronic chips (optionally arranged on substrates or carriers) may be arranged or placed, e.g. in each recess one, two, three, or even more electronic chips may be placed. However, the number of electronic chips per recess and/or per baseplate may be different.

According to exemplary embodiments of the electronic module at least two of the plurality of baseplates are stacked on top of each other.

Thus, a stack of electronic chips or modules may be formed, wherein each baseplate preferably comprises at least one electronic chip attached in the recess of the baseplate. By stacking the plurality of electronic chips on top of each other it may be possible to provide a space saving electronic module. Furthermore, by stacking a plurality of electronic chips on top of each other the baseplate of one stack layer or level may form a cover layer for the stack layer or level arranged below in the stack.

According to exemplary embodiments the method of manufacturing a baseplate the recess is formed by one process out of the group consisting of drilling; etching; punching; stamping; machining; milling; 3D-printing; extruding and/or cold-extruding.

In particular, the drilling or etching may be performed by laser, a selective or non-selective etching agent, or the like.

In the following an exemplary embodiment of an electronic module including a baseplate according to an exemplary embodiment is described in connection with the figures.

In particular, FIG. 1 schematically depicts a perspective view of a components of an electronic module 100 comprising a baseplate 101 in which a recess or cavity 102 is formed. The baseplate 101 comprises or consists of a (thermally and electrically) conductive material like copper, copper alloy, aluminum or aluminum alloy or any other suitable material. In addition to the recess 102 the baseplate 101 may comprise additional structures or pattern like through holes 103 and/or lateral channel or notches 104 for fixing. It should be mentioned that according to the embodiment of FIG. 1 the recess 102 is formed by a blind hole and not by a through hole. Onto the bottom of the recess a substrate or carrier 105 like a direct copper bond (DCB) package is fixed. For example, the substrate 105 may be glued or soldered to the bottom of the recess 102.

Before the substrate 105 is fixed to the baseplate 101 electronic chips 106 like pre-assembled SOT or SON, VSON (IGBT/MOS) are assembled to the substrate, e.g. DBC. For the assembly of the electronic chips onto the substrate standard SMD pick and place machines can be used. In addition to the electronic chips standard and potential low cost terminals 107 are soldered to the substrate. It should be mentioned that the recess or cavity is deep enough to accommodate the substrate having mounted thereon the electronic chips 106. The cavity or recess 102 may avoid the necessity of a special plastic housing, as the baseplate forms the main parts of a housing or enclosure. Thus, it may as well be possible to reduce the cost by avoiding the use of a special plastic housing but using relative cheap material like aluminum of the baseplate as the housing. In addition to the gluing of the substrate silicone rubber (like SilGel), epoxy or other materials may be used as additional insulator. The electronic module may thus, due to the materials and the used process techniques (like SMD pick and place techniques) form or be part of a low cost power hybrid subsystem.

FIG. 2 schematically shows the embodiment of FIG. 1 having arranged thereon a thin layer 210 or foil of an insulator material, like Kapton which forms a part of the insulation of the substrate arranged (soldered, glued) in the recess of the baseplate. In order to use the terminals 107 for electrically contacting the electronic chips the terminals 107 projects out of the thin layer 210. This insulation layer 210 may ensure creepage and clearance distances once the electronic module is assembled on boards, e.g. onto a PCB or once a PCB board is soldered on top of the electronic module. The thin layer 210 may also extend beyond the baseplate or a body of the electronic module so that it may be avoidable that the baseplate, forming a heatsink is facing directly with the board fixed or soldered thereon.

FIG. 3 schematically shows a side or lateral view of the electronic module of FIG. 2. In particular, FIG. 3 shows sidewalls of the baseplate 101 and the terminals 107 extending over the top of the electronic module 100 in order to enable an electrically contacting of the electronic chips in the recess of the baseplate. The electronic module 100 may form an extremely thin subsystem and providing specific compensation paths so that it may be applied or used in systems operating at high switching frequency and in application requiring reduced vertical dimensions.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of manufacturing an electronic module, the method comprising:
   providing a baseplate;
   forming a recess in one main surface of the baseplate, wherein the recess is adapted to accommodate an electronic chip, attaching the electronic chip to a substrate or carrier before placing the electronic chip in the recess, and placing the electronic chip in the recess.

2. The method according to claim 1, wherein the electronic chip is a pre-packaged dice.

3. The method according to claim 1, further comprising attaching the electronic chip to the baseplate.

4. The method according to claim 3, further comprising adhering the electronic chip to the baseplate.

5. The method according to claim 1, further comprising providing an insulating layer arranged on the one main surface of the baseplate.

6. The method according to claim 1, further comprising providing a mold compound at least partially encapsulating the baseplate and the electronic chip placed in the recess of the baseplate.

7. The method according to claim 1, further comprising providing terminals arranged to contact the electronic chip with an exterior of the electronic module.

8. The method according to claim 1, comprising manufacturing a plurality of baseplates each having formed therein a recess in one main surface of the baseplate, wherein the recess is adapted to accommodate an electronic chip and placing a plurality of electronic chips in the plurality of recesses of the plurality of baseplates.

9. The method according to claim 8, further comprising stacking at least two of the plurality of baseplates on top of each other.

10. The method according to claim 1, wherein the electronic module is a power module and the baseplate consists of electrically conductive material.

11. A method of manufacturing an electronic power module, the method comprising:

providing a baseplate consisting of an electrically conductive material;

forming a recess in one main surface of the baseplate;

attaching an electronic chip to a substrate or carrier before placing the electronic chip in the recess; and placing the electronic chip in the recess.

12. The method according to claim 1, wherein the recess is formed by one process out of the group consisting of:

drilling;

machining;

milling;

etching;

punching;

stamping;

extruding;

cold extruding; and 3D-printing.

13. The method according to claim 1 wherein the baseplate comprises a conductive material.

14. The method according to claim 1, wherein the electronic module is a power module and the baseplate consists of electrically conductive material.

15. The method according to claim 1, wherein forming the recess comprises forming the recess with a depth adapted to fully accommodate the electronic chip.

16. The method according to claim 1, wherein the baseplate has a thickness in the range between 2 mm and 10 mm.

17. The method according to claim 13, wherein the baseplate comprises a material selected out of the group consisting of:

aluminum;

brass;

copper; and

Metal Matrix Composite.

18. The method according to claim 1, further comprising:

forming a contact area in the recess.

* * * * *